(12) United States Patent  
Miyawaki et al.

(10) Patent No.: US 7,170,779 B2  
(45) Date of Patent: Jan. 30, 2007

(54) NON-VOLATILE MEMORY USING ORGANIC BISTABLE DEVICE

(75) Inventors: Mamoru Miyawaki, Irvine, CA (US); Liang Guirong, Sunnyvale, CA (US)

(73) Assignee: Canon Kabushiki Kaisha, Tokyo (JP)

( * ) Notice: Subject to any disclaimer, the term of this patent is extended or adjusted under 35 U.S.C. 154(b) by 78 days.

(21) Appl. No.: 10/871,754

(22) Filed: Jun. 17, 2004

(65) Prior Publication Data

US 2005/0281082 A1 Dec. 22, 2005

(51) Int. Cl.  
  *G11C 11/34* (2006.01)
(52) U.S. Cl. .................................. 365/174; 365/164
(58) Field of Classification Search ................ 365/174  
See application file for complete search history.

(56) References Cited

U.S. PATENT DOCUMENTS

| | | | | |
|---|---|---|---|---|
| 5,837,391 A | * | 11/1998 | Utsugi | 428/690 |
| 6,097,147 A | * | 8/2000 | Baldo et al. | 428/917 |
| 6,784,017 B2 | * | 8/2004 | Yang et al. | 257/E51.009 |
| 6,797,412 B1 | * | 9/2004 | Jain et al. | 257/103 |

2004/0027849 A1 2/2004 Yang et al.

OTHER PUBLICATIONS

Presentation by Liping Ma, et al. "High Performance Organic Nonvolatile Memory Device", available at http://klabs.org/richcontent/MemoryContent/nvmt_symp/nvmts_2002/docs/09/09_ma_s.pdf (visited Jun. 8, 2004).  
Liping Ma, et al. "Nonvolatile electrical bistability of organic/metal-nanocluster/organic system", Applied Physics Letters, vol. 82(9), pp. 1419-1421, Mar. 3, 2003.  
Y. N. Hwang, et al. "Writing Current Reduction for High-Density Phase Change RAM", IEDM Technical Digest (2003).

* cited by examiner

*Primary Examiner*—Thong Q. Le  
(74) *Attorney, Agent, or Firm*—Fitzpatrick, Cella, Harper & Scinto

(57) ABSTRACT

The present invention provides an organic bistable device for use in non-volatile memories. The organic bistable device comprises a first and a second metal electrode sandwiching a first and a second organic layer with a metal-nanocluster layer positioned between the first and second organic layers. The device further comprises a first electron blocking layer positioned between the metal-nanocluster layer and one of the metal electrodes. This structure provides an organic bistable device with improved charge retention characteristics.

45 Claims, 7 Drawing Sheets

NON-VOLATILE MEMORY USING ORGANIC BISTABLE DEVICE

BACKGROUND OF THE INVENTION

1. Field of the Invention

The present invention relates to organic bistable devices and particularly to utilization of such devices in a non-volatile memory.

2. Description of the Related Art

Typically, non-volatile memory devices are created with inorganic bistable elements. Recently, attempts have been made to utilize organic bistable devices in both volatile and non-volatile memory. For example, U.S. Patent Application Publication No. 2004/0027849 by Yang et al., incorporated herein by reference, describes an organic bistable device to be used in a memory cell.

Although promising, the bistable devices discussed by Yang are unsuitable for practical and commercial use, as they exhibit short charge retention times.

SUMMARY OF THE INVENTION

The present invention addresses the foregoing by providing an organic bistable device which contains an electron blocking layer.

According to one aspect of the invention, an organic bistable device comprises first and second metal electrodes sandwiching first and second organic layers with a metal-nanocluster layer positioned between the first and second organic layers. The organic bistable device further comprises an electron blocking layer positioned between the metal-nanocluster layer and one of the metal electrodes.

According to still another aspect of the invention, the organic bistable device includes first and second electron blocking layers. Preferably, the first electronic blocking layer has a higher energy gap than that of the second electron blocking layer. In this aspect, it is preferable to position the first electron blocking layer so that it is between the metal-nanocluster layer and the metal electrode that is set to a higher voltage potential.

The first and second metal electrodes are formed from any suitable metal or metal-based compound, such as Al, Cu, Ag, ITO, AlSi and AlSiCu.

The first and second organic layers are formed from any P-type or N-type semiconductor material, such as CuPc, AIDCN and ALq3.

The metal-nanocluster layer is preferably formed of the materials described in the aforementioned U.S. Patent Application Publication No. 2004/0027849, and preferably is made of Al nano particles in AIDCN.

The first and second electron blocking layers are formed of an electron blocking material that has a higher energy gap than that of the material chosen for the first and second organic layers. When the organic layers are formed of CuPc, for example, suitable materials for the electron blocking layers are NPB, NPD, TPD and PVK.

According to another aspect of the invention, the organic bistable device further includes an electron injection layer positioned between the first electron blocking layer and one-of the organic layers.

According to more preferred aspects of the invention, the organic bistable device is part of an array of non-volatile memory devices which also includes a grid defined by gate lines and vertical lines, a transistor switched by one of the gate lines, and a reference voltage line. The first metal electrode of the organic bistable device is switchably connected by the transistor to the vertical line, and the second metal electrode of the organic bistable device is connected to the reference voltage line. The combination of the organic bistable device and the transistor is a memory unit.

Preferably, the electron blocking layer is positioned such that it is between the metal-nanocluster layer and the metal electrode that has the higher voltage potential.

According to another aspect of the present invention, reset, write and read operations are performed on memory units of the non-volatile memory. The reset operation is achieved by selecting a line of memory units by applying voltage to turn on the transistor of the gate line, applying a voltage potential $V_{erase}$ to the vertical line, deselecting the line of memory units by applying a voltage to turn off the transistor of the gate line, and normalizing the vertical line by applying the voltage potential $V_L$.

The write operation is achieved by selecting a line of memory unit by applying voltage to turn on the transistor of the gate line, applying a voltage potential $V_H$ to the vertical line in the case that the line of memory units are to be turned on, and applying a voltage potential $V_L$ to the vertical line in the case that the line of memory units are to be turned off, deselecting the line of memory units by applying voltage to turn off the transistor of the gate line, and normalizing the vertical line by applying the voltage potential $V_L$.

The read operation for "normally off" memory units is achieved by normalizing the vertical line by applying a voltage potential $V_L$, removing the voltage potential $V_L$ from the vertical line so that it is floating, selecting a line of memory units by applying voltage to turn on the transistor of the gate line, waiting a predetermined time, connecting the vertical line of one memory unit to a sense amplifier, and reading the voltage of the connected vertical line, wherein a reading above a read-out reference voltage indicates an off state, and a reading below a read-out reference voltage indicates an on state. For an array of "normally off" memory units, the read-out reference voltage is an intermediate voltage between ground and $V_L$.

The read operation for "normally on" memory units is achieved by normalizing the vertical line by applying a voltage potential $V_L$, removing the voltage potential $V_L$ from the vertical line so that it is floating, selecting a line of memory units by applying voltage to turn on the transistor of the gate line, waiting a predetermined time, connecting the vertical line of one memory unit to a sense amplifier, and reading the voltage of the connected vertical line, wherein a reading below a read-out reference voltage indicates an off state, and a reading above a read-out reference voltage indicates an on state. For an array of "normally on" memory units, the read-out reference voltage is an intermediate voltage between $V_H$ and $V_L$.

This brief summary has been provided so that the nature of the invention may be understood quickly. A more complete understanding of the invention can be obtained by reference to the following detailed description of the preferred embodiment thereof in connection with the attached drawings.

DETAILED DESCRIPTION OF THE INVENTION

Figure 1:
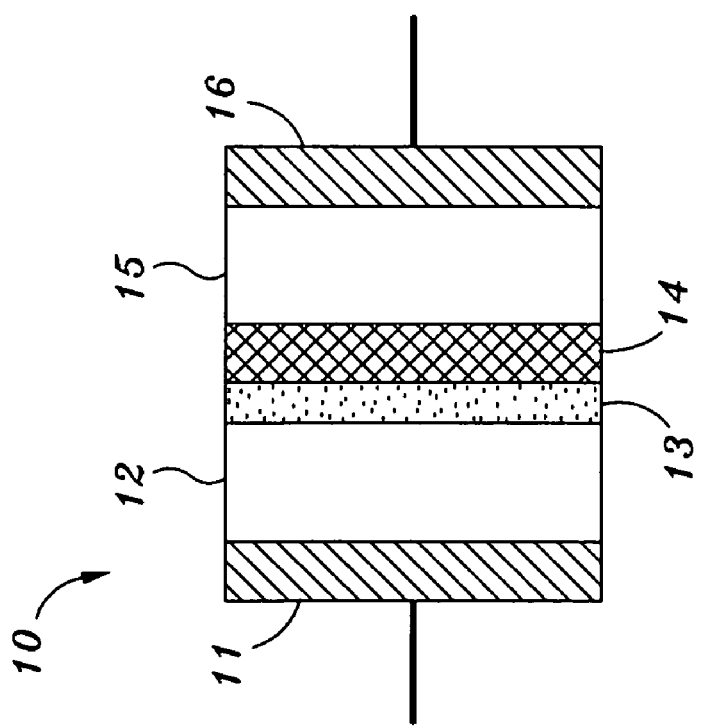
FIG. 1 is a cross-section of an organic bistable device which contains one electron blocking layer.

FIG. 1 depicts one arrangement of an organic bistable device ("OBD") according to the present invention. OBD 10 includes organic layers 12 and 15 sandwiched between metal electrodes 11 and 16. Metal-nanocluster layer 13 is positioned between organic layers 12 and 15. In addition, an OBD according to the present invention includes an electron blocking layer, which is positioned between the metal-nanocluster layer and one of the electrodes. The arrangement depicted in FIG. 1 shows electron blocking layer 14 positioned between metal-nanocluster layer 13 and organic layer 15. Through the use of electron blocking layers, the OBDs of the present invention exhibit longer charge retention times than conventional organic bistable devices.

The first and second metal electrodes are formed from any suitable metal or metal-based compound, such as aluminum (Al), copper (Cu), silver (Ag), indium tin oxide (ITO), aluminum silicon (AlSi) and aluminum silicon copper (AlSiCu). It is acceptable to use the same material for both metal electrodes or different materials for each electrode.

The organic layers are preferably formed of copper phthalycyanine (CuPc), tris-(8-hydoxquinolinolato) aluminum (Alq3), or 2-amino-4,5-imidazoledicarbonitrile (AIDCN), or any other P-type of N-type semiconductor material. It is acceptable to use the same material for both organic layers or different materials for each layer.

The metal-nanocluster layer is preferably a metal-nanocluster layer as disclosed in the aforementioned U.S. Patent Application Publication No. 2004/0027849, and preferably is made of Al nano-particles in AIDCN. Other appropriate materials for use as nano-particles in the metal-nanocluster layer include copper, silver, gold, nickel, magnesium, indicum, calcium, and lithium. Additional appropriate materials include metal alloys of the above metals, conductive oxides, conducting polymers, such as 3,4-polyethylenedioxy-thiphenepolystyrene-sulfonate (PEDOT), doped polyaniline, and organic conductors, such as buckminster fullerene.

Suitable materials for the electron blocking layers are materials that have electron blocking functionality and include 4,4-bis(1-napthylphenylamino) biphenyl (NPB), 4,4-bis(-1-naptyl-N-phenyl-amino) biphenyl (NPD), 1-biphenyl-4,4 diamine (TPD), and poly(9-vinyl carbazole) (PVK). The characteristics of materials with electron blocking functionality include low energy (low ionization potential) at the highest occupied molecular orbit (HOMO), high energy at the lowest unoccupied molecular orbit (LUMO), high hole mobility, electron rich groups, and facile charge delocation.

Figure 9:
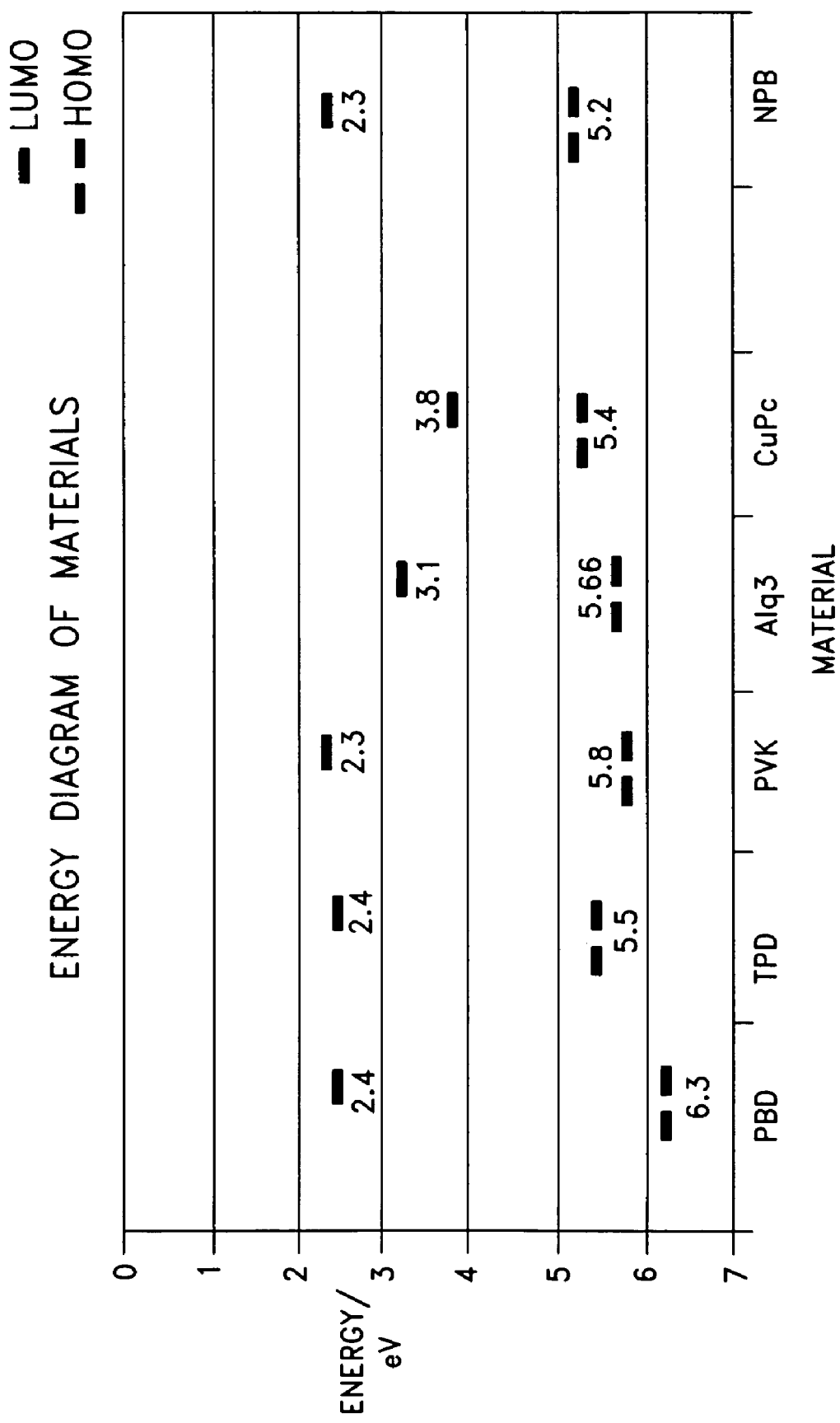
FIG. 9 is an energy diagram of materials.

It is preferable for the material chosen for the electron blocking layer to have a higher energy gap than that of the material chosen for the organic layers. Energy gap is defined as the difference between the LUMO energy and the HOMO energy. A chart of the energy levels of some materials is shown in FIG. 9. As one example, when organic layers 12 and 15 are formed from CuPc, suitable materials for the electron blocking layer are NPD, NPD, TPD, and PVK. As another example, when organic layers 12 and 15 are formed from Alq3, suitable materials for the electron blocking layer are NPD, NPD, TPD, and PVK.

By utilizing an electron blocking layer with a higher energy gap than the organic layer, the amount of energy required to inject electrons into the organic layers with a forward bias voltage is increased. This will result in a larger threshold voltage of the OBD. When the large forward bias is removed, the electrons in the OBD will not be discharged or detrapped, since to do so they would need to overcome the higher contact energy barrier induced by the electron blocking layer. As such, the electrons will be kept in the metal-nanocluster layer, and the OBD will be kept in a high conductivity state for a longer time, thus achieving improved retention characteristics over OBDs without electron blocking layers.

Figure 2:
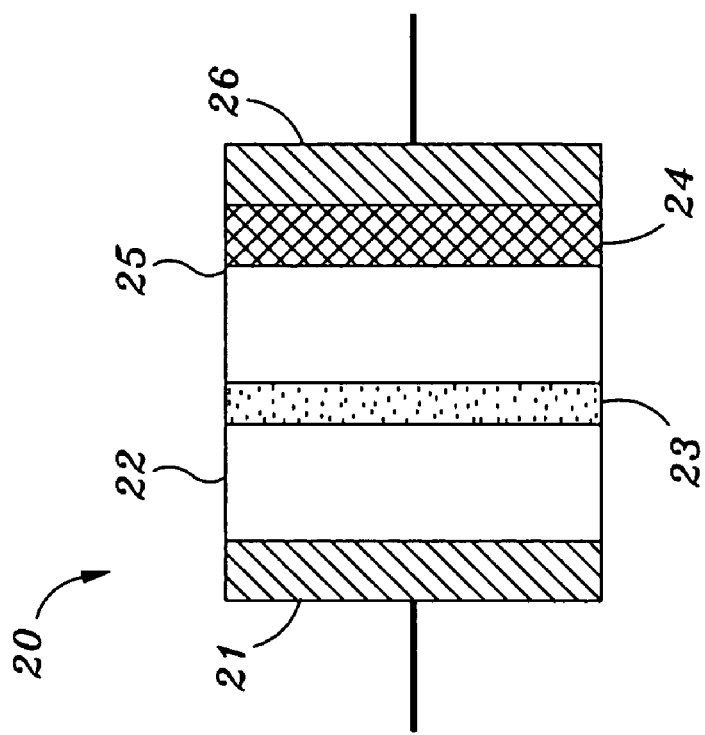
FIG. 2 is a cross-section of an organic bistable device which contains one electron blocking layer.

The improved retention characteristics can be achieved with arrangements other than that depicted in FIG. 1. Another suitable layer arrangement for the OBD of the present invention is shown in FIG. 2. FIG. 2 depicts OBD 20 with metal electrodes 21 and 26 sandwiching organic layers 22 and 25. Metal-nanocluster layer 23 is positioned between organic layers 22 and 25. Electron blocking layer 24 is positioned between organic layer 25 and metal electrode 26. The materials suitable for use in FIG. 2 are the same as those for FIG. 1.

In addition to the above-described OBD layer arrangements containing one electron blocking layer, two electron blocking layers can also be used. As before, the energy gap of both electron blocking layers should be higher than that of the organic layers. FIGS. 3–6 show exemplary arrangements of OBDs with two electron blocking layers, and are discussed more fully as follows.

Figure 3:
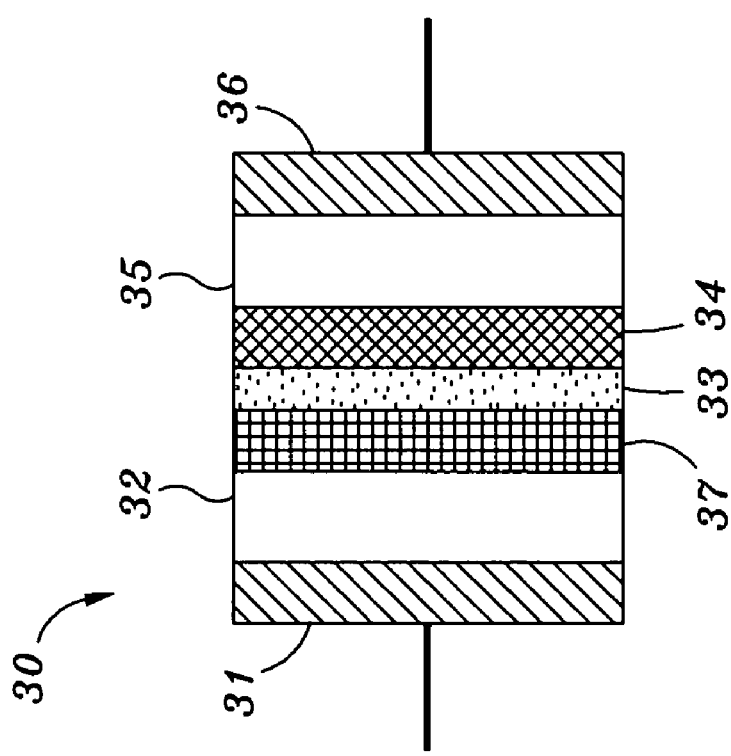
FIG. 3 is a cross-section of an organic bistable device which contains two electron blocking layer.

FIG. 3 depicts OBD 30 with metal electrodes 31 and 36 sandwiching organic layers 32 and 35. Metal-nanocluster layer 33 is positioned between organic layers 32 and 35. Electron blocking layer 34 is positioned between organic layer 35 and metal-nanocluster layer 33, while electron blocking layer 37 is positioned between organic layer 32 and metal nano-cluster layer 33. The energy gap of electron blocking layer 34 should be higher than that of electron blocking layer 37. As such, OBDs with two electron layers should use different materials for each layer. The materials suitable for use in FIG. 3 are the same as those for FIG. 1.

Figure 4:
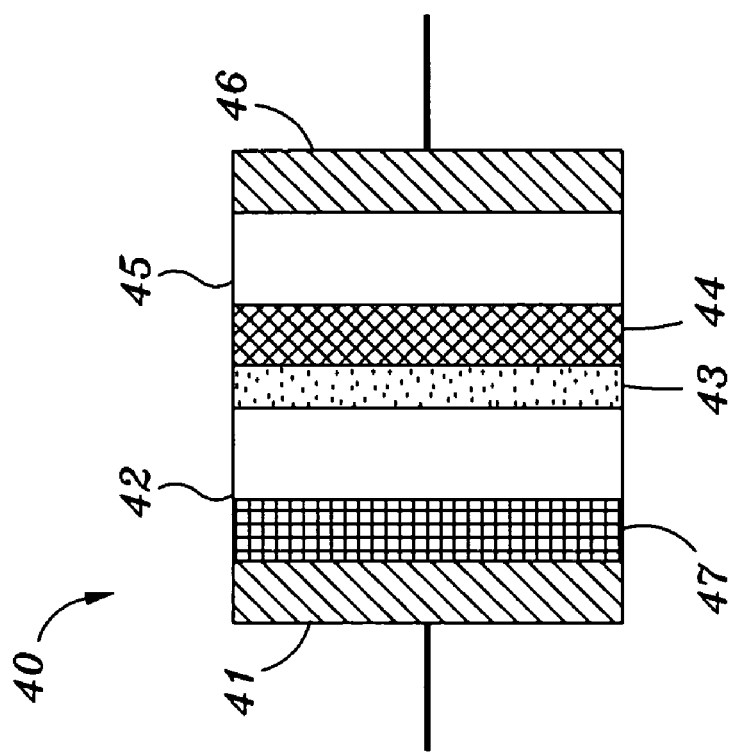
FIG. 4 is a cross-section of an organic bistable device which contains two electron blocking layer.

FIG. 4 depicts OBD 40 with metal electrodes 41 and 46 sandwiching organic layers 42 and 45. Metal-nanocluster layer 43 is positioned between organic layers 42 and 45. Electron blocking layer 44 is positioned between organic layer 45 and metal-nanocluster layer 43, while electron blocking layer 47 is positioned between organic layer 42 and metal electrode 41. The energy gap of electron blocking layer 44 should be higher than that of electron blocking layer 47. The materials suitable for use in FIG. 4 are the same as those for FIG. 1.

Figure 5:
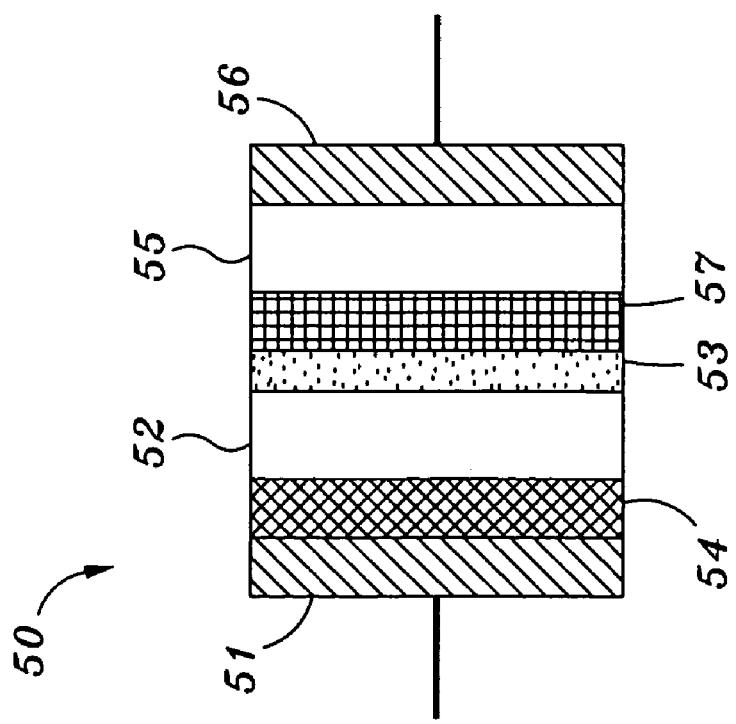
FIG. 5 is a cross-section of an organic bistable device which contains two electron blocking layer.

FIG. 5 depicts OBD 50 with metal electrodes 51 and 56 sandwiching organic layers 52 and 55. Metal-nanocluster layer 53 is positioned between organic layers 52 and 55. Electron blocking layer 54 is positioned between organic layer 52 and metal electrode 51, while electron blocking layer 57 is positioned between organic layer 55 and metal-nanocluster layer 53. The energy gap of electron blocking layer 54 should be higher than that of electron blocking layer 57. The materials suitable for use in FIG. 5 are the same as those for FIG. 1.

Figure 6:
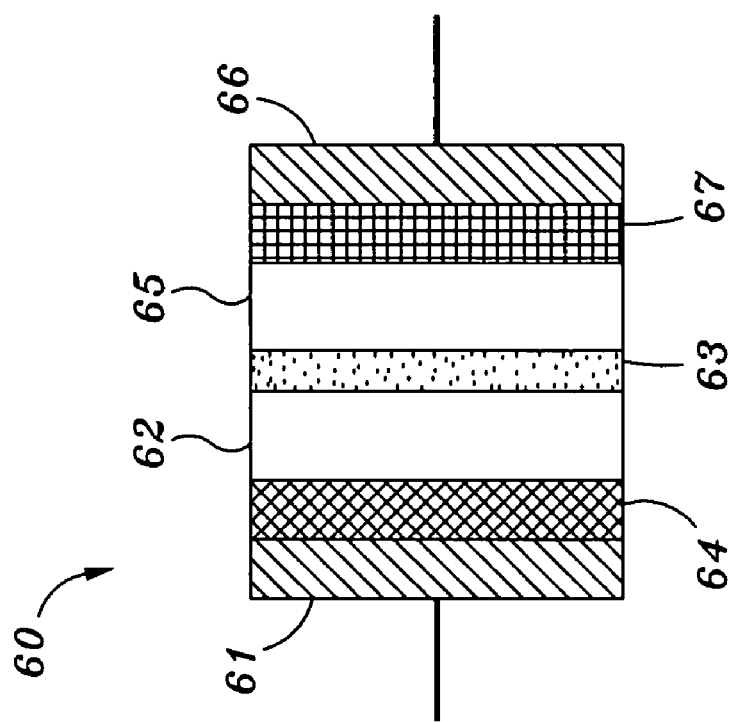
FIG. 6 is a cross-section of an organic bistable device which contains two electron blocking layer.

FIG. 6 depicts OBD 60 with metal electrodes 61 and 66 sandwiching organic layers 62 and 65. Metal-nanocluster layer 63 is positioned between organic layers 62 and 65. Electron blocking layer 64 is positioned between organic layer 62 and metal electrode 61, while electron blocking layer 67 is positioned between organic layer 65 and metal electrode 66. The energy gap of electron blocking layer 64 should be higher than that of electron blocking layer 67. The materials suitable for use in FIG. 6 are the same as those for FIG. 1.

In addition to the arrangements discussed above, any OBD of the present invention may also include an electron injection layer adjacent to one of the electron blocking layers. Preferably, the electron injection layer is made of Alq3.

The OBDs described above are formed in thin layers or films, as these fabrication techniques are well known. The metal electrode layers are deposited by thermal evaporation, or by other methods such as e-beam evaporation or sputtering. Typically the metal electrodes are 40 nm thick. The organic layers are typically formed by thermal evaporation and are 20 nm to 80 nm thick. The electron blocking layers are typically deposited by thermal evaporation and are 10 nm to 30 nm thick. The metal-nanocluster layer is formed by thermal co-evaporation of Al and AlDCN and is typically 20 nm to 40 nm thick.

Examples of practice are as follows:

EXAMPLE 1

An organic bistable device is fabricated as shown in FIG. 1. The first step of the fabrication process involves the thermal evaporation of a layer (40 nm) of aluminum (Al) on a silicon substrate. This Al layer is metal electrode 16 of OBD 10. Next, organic layer 15 is formed by depositing by thermal evaporation of layer (30 nm) of CuPc on top of metal electrode 16. Next, electron blocking layer 14 is formed by thermally evaporating a layer (10 nm) of TPD on top of organic layer 15. Next, metal-nanocluster layer 13 is formed by thermal co-evaporation of a layer (20 nm) of Al and AlDCN on top of electron blocking layer 14. Next, organic layer 12 is formed by the thermal evaporation of a layer (30 nm) of CuPc on top of metal-nanocluster 13. Finally, metal electrode 11 is formed by thermally evaporating a layer (40 nm) of aluminum on top of organic layer 12.

EXAMPLE 2

An organic bistable device is fabricated as shown in FIG. 3. The first step of the fabrication process involves e-beam evaporation of a layer (40 nm) of copper (Cu) on a silicon substrate. This Cu layer is metal electrode 36 of OBD 30. Next, organic layer 35 is formed by depositing, by thermal evaporation, a layer (50 nm) of Alq3 on top of metal electrode 36. Next, electron blocking layer 34 is formed by thermally evaporating PVK on top of organic layer 35. Next, metal-nanocluster layer 33 is formed by thermal co-evaporation of a layer (20 nm) of Al and AlDCN on top of electron blocking layer 34. Next, electron blocking layer 37 is formed by thermally evaporating TPD on top of metal-nanocluster layer 33. Next, organic layer 32 is formed by the thermal evaporation of a layer (30 nm) of Alq3 on top of metal-nanocluster 33. Finally, metal electrode 31 is formed by e-beam evaporation of a layer (40 nm) of Cu on top of organic layer 32.

Figure 7:
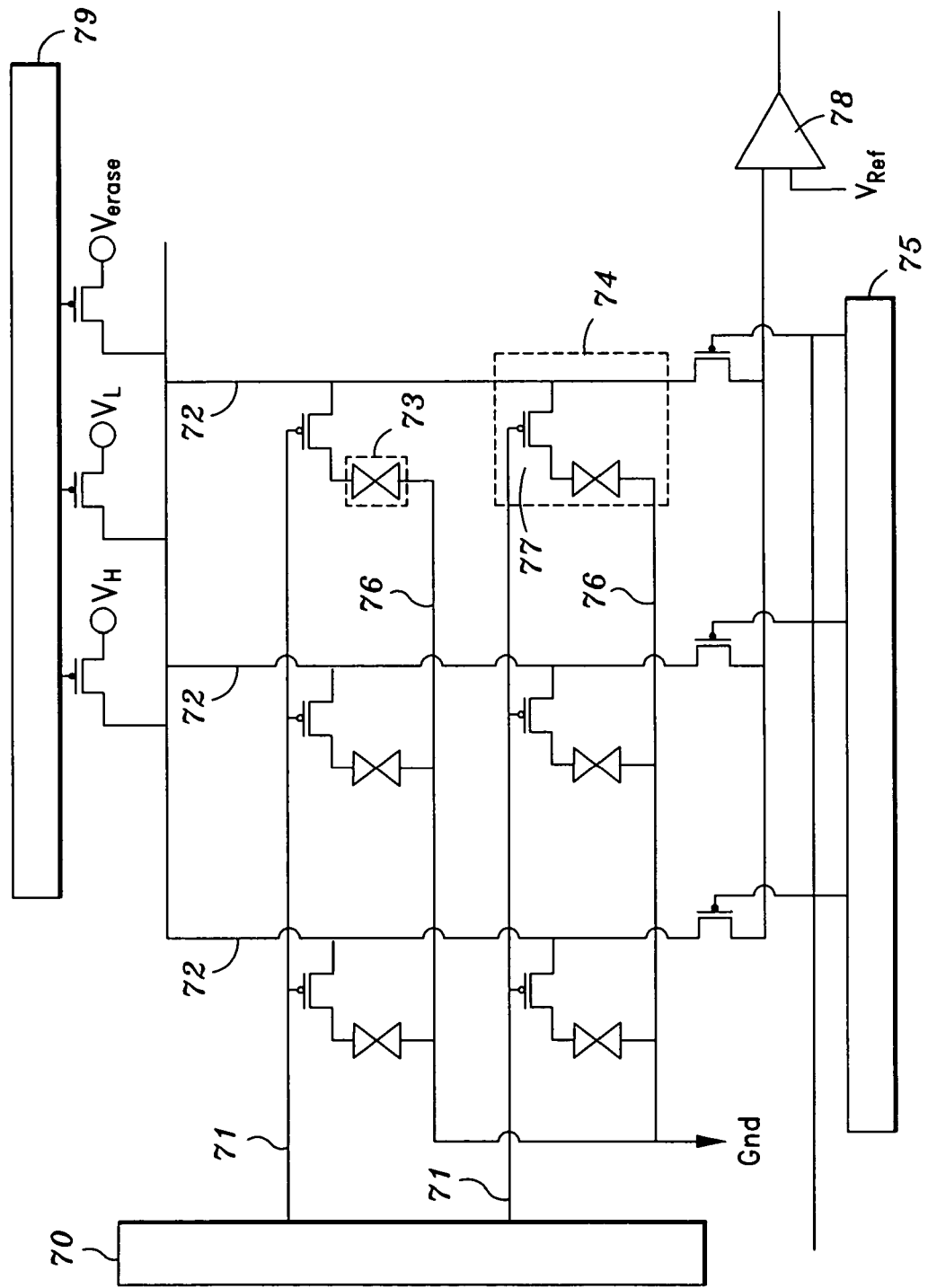
FIG. 7 is a schematic of a "normally off" non-volatile memory according to the present invention.

Given their bistable and long charge-retention characteristics, the OBDs described above can be formed into a non-volatile memory device by combining an OBD with a transistor. An array of non-volatile memory devices is depicted in FIG. 7. Memory unit 73 can be implemented as any of the OBDs shown in FIGS. 1–6. Non-volatile memory device 74 includes memory unit 73 and transistor 77. Transistor 77 can be implemented as either an organic thin film transistor (TFT) or as a silicon MOSFET.

One electrode of each of memory units 73 is switchably connected by transistors 77 to a matrix of gate lines 71 and vertical lines 72. Gate shift register 70 selects a line of non-volatile memory devices 74 by applying voltage to gate line 71 to turn on the transistors 77. In this way, horizontal shift register 79 can selectively apply a voltage potential to one electrode of a memory unit 73 through its corresponding transistor 77. The other electrode of each memory unit 73 is connected to reference voltage lines 76, which is tied to ground.

As shown, in FIG. 7 horizontal shift register 79 can set vertical line 72 to a voltage level of $V_H$, $V_L$ or $V_{erase}$. $V_H$, which is nominally 5 V, is the voltage at which a memory unit 73 is in an "ON" memory state. $V_L$, which is nominally 1 V, is the voltage at which a memory unit 73 is in an "OFF" memory state. $V_{erase}$, which is nominally between −1 and −1.5 V, is the voltage at which a memory unit 73 is reset.

Since reference voltage line 76 is tied to ground, the array of memory units depicted in FIG. 7 are "normally off" memory units. In order to achieve the long charge retention times, the OBDs of FIGS. 1–6 are connected so that the electron blocking layer with the highest energy gap is nearest the metal electrode with the higher voltage potential. For instance, if OBD 10 of FIG. 1 is used as memory unit 73, metal electrode 16 is connected to transistor 77 and metal electrode 11 is connected to reference voltage line 76, as both $V_H$ and $V_L$ (the writing voltages) have a higher voltage potential than ground. Similarly, metal electrodes 26, 36, 46, 51 or 61 are connected to transistor 77, and metal electrodes 21, 31, 41, 56, or 66 are connected to reference voltage line 76 for OBDs 20, 30, 40, 50, and 60, respectively.

The reset, write, retention and read operations for the non-volatile memory of FIG. 7 will now be described.

The first step in resetting a line of memory units 73 in the non-volatile memory device array is selecting a line of memory units 73 with gate shift register 70 by applying a voltage to a gate line 71, thus turning on a transistor 77. Next, horizontal shift register 79 induces $V_{erase}$ onto vertical line 72. This creates a negative potential at the electrode of memory unit 73 that is connected to transistor 77, and in effect, negatively biases the OBD and creates a low resistance state. As such, the memory units 73 are reset. Finally, the line of memory units 73 is deselected by applying a voltage to gate line 71 to turn off transistor 77, and horizontal shift register 79 induces $V_L$ onto vertical line 72.

Writing into the memory units is similar to the process for resetting them. First, a line of memory units 73 is selected by turning on transistors 77 of a gate line 72 with gate shift register 70. Next, if the memory units 73 are to be put into an "ON" state, horizontal shift register 79 induces $V_H$ onto vertical line 71. Likewise, if the memory units 73 are to be put into an "OFF" state, horizontal shift register 79 induces $V_L$ onto vertical line 72. Again, the line of memory units are deselected by turning off transistor 77 of gate line 71 with gate shift register 70, and horizontal shift register 79 induces $V_L$ onto vertical line 72.

After the write step, the memory units 73 are in the retention period. If $V_L$ was written into the memory unit 73, the voltage at the transistor-side electrode of memory units 73 is at $V_L$ potential. Likewise, If $V_H$ was written into the memory unit 73, the voltage at the transistor-side electrode of memory units 73 is at $V_H$ potential. In either case, the potential at the transistor-side electrode of memory units 73 is higher than the electrode connected to reference voltage line 76, which is tied to ground. Therefore, electrons are trapped in the OBD used for the memory units 73 due to the electron blocking layer and the electric field generated.

During the retention period, the transistor-side electrode of memory units 73 is essentially floating, given the high resistance of transistors 77 when turned off. However, the potential at the transistor-side electrode will gradually converge to the potential of the vertical line, which is at $V_L$. Nonetheless, the memory units 73 will remain in an "ON" state due to the internal electric field created by the electron blocking layer. As such, long charge-retention times are achieved.

Figure 10:
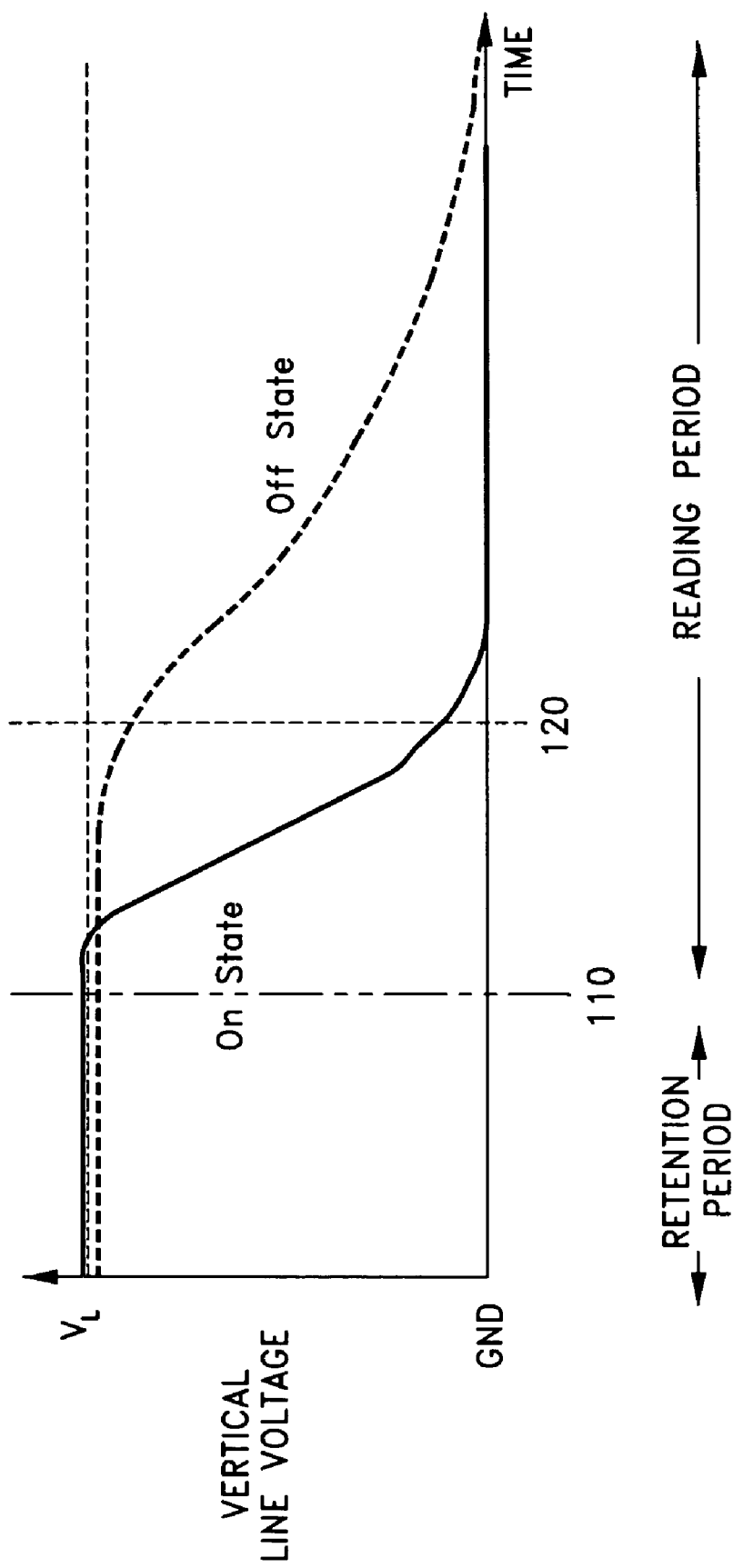
FIG. 10 is a graph showing vertical line voltage over time.

The first step of reading a line of memory units 73 involves inducing $V_L$ onto vertical line 72 with horizontal shift register 79. Next, horizontal shift register 79 turns off the $V_L$ voltage source so that vertical line 72 is in a floating state. Then, gate shift register 70 selects the line of memory units 73 that are to be read by applying voltage to gate line 71 to turn on transistors 77. As shown in FIG. 10, the voltage at vertical line 72, which is equivalent to the voltage at the transistor-side electrode of memory units 73, begins to converge to ground at read-start time 110. Read-start time 110 corresponds to the time at which gate shift register 70 selects a line of memory units 73. As seen in FIG. 10, the voltage of vertical line 72 drops considerably more quickly when a memory unit 73 had been put into an "ON" state than if it had been put into an "OFF" state. This is because, the memory unit 73 has a much lower resistance in the "ON" state than in the "OFF" state. A memory unit in the "OFF" state has a resistance of $10^4$ to $10^6$ times greater than that of a memory unit in the "ON" state.

Given these characteristics, the read-out of the memory unit is delayed for some amount time so that the voltage potentials of the "ON" state and "OFF" state diverge. The appropriate amount of delay time can be determined by calculating the time constant of the OBD used for memory units 73. The time constant is equal to the resistance of the OBD multiplied by its capacitance. Typically, the delay time will range from 0.1 to 1.0 milliseconds. This delay is depicted as read-out time 120 in FIG. 10.

At read-out time 120, gate shift register 70 deselects the selected line of memory units 73 by turning off transistors 77, and read-out register 75 selectively turns on a transistor so that a vertical line 72 for a specific memory unit 73 is connected to sense amplifier 78. If the voltage sensed at sense amplifier 78 is above a read-out reference voltage, the memory unit 73 is determined to have been in the "OFF" state, and if the voltage sensed at sense amplifier is below a read-out reference voltage, the memory unit 73 is determined to have been in the "ON" state. For the "normally off" non-volatile memory array of FIG. 7, the read-out reference voltage is an intermediate voltage level between ground and $V_L$. In a preferred embodiment, the read-out reference voltage is halfway between the difference of $V_L$ and ground, and is nominally 0.5 V.

Figure 8:
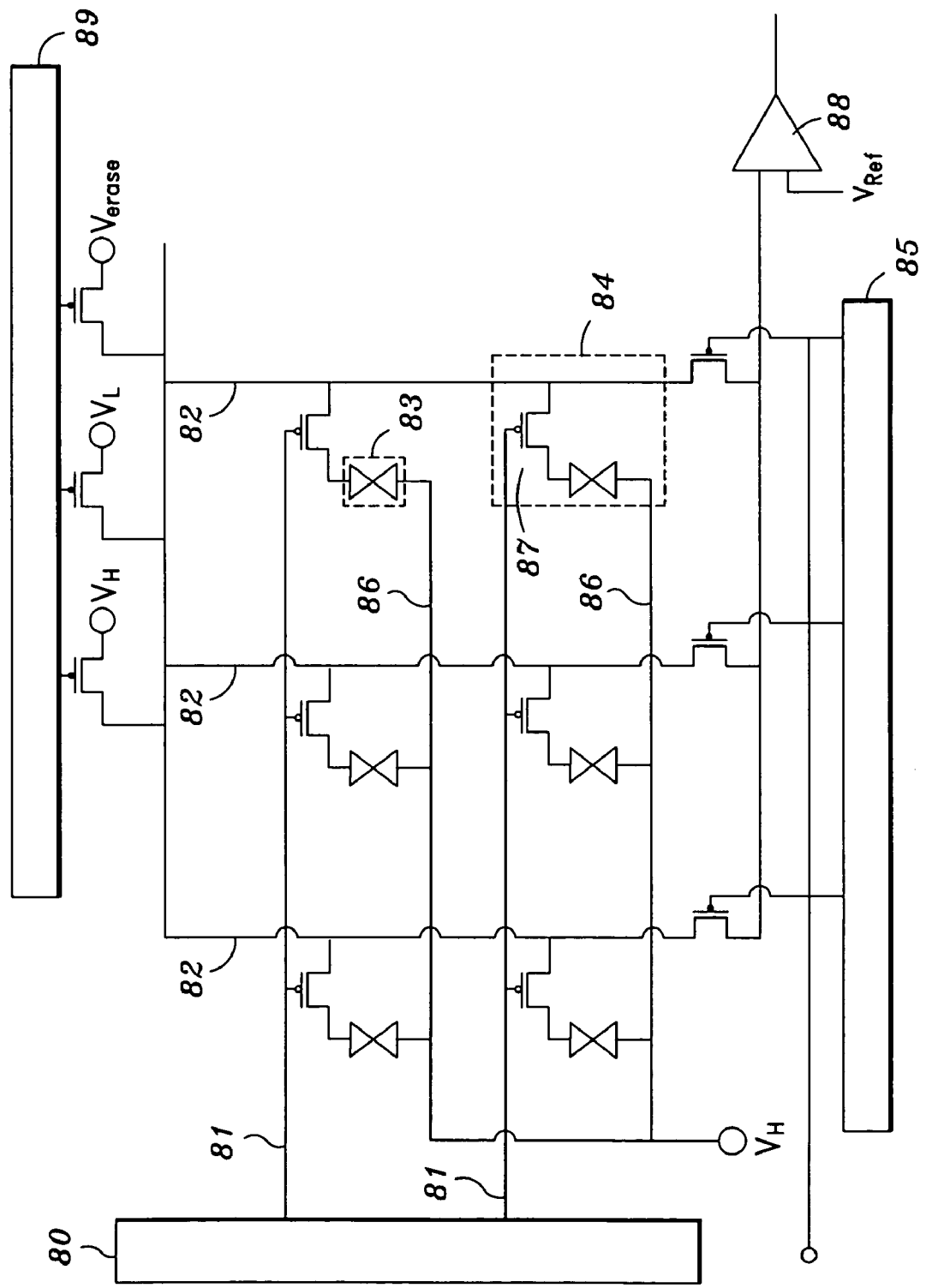
FIG. 8 is a schematic of a "normally on" non-volatile memory according to the present invention.

While the above configuration and operation descriptions apply to "normally off" non-volatile memories as shown in FIG. 7, the OBDs of the present invention can also be used in "normally on" non-volatile memory configurations. FIG. 8 depicts a "normally on" non-volatile memory. This memory is similar to that shown in FIG. 7, except that the reference voltage line 86 is held at $V_H$. The non-volatile memory of FIG. 8 also includes gate shift register 80, gate lines 81, horizontal shift register 89, vertical lines 82, non-volatile memory devices 84, memory units 83, transistors 87, read-out register 85, and sense amplifier 88. As with the matrix of FIG. 7, in order to achieve the long charge retention times, the OBDs of FIGS. 1–6 are connected to the matrix of FIG. 8 so that the electron blocking layer with the highest energy gap is nearest the metal electrode with the higher voltage potential. However, since the reference voltage line 86 now has a higher potential than the voltage potential supplied by vertical lines 82, the connection of each of OBDs 10 through 60 must be flipped.

The reset operation for the "normally on" memory of FIG. 8 is the same as described above, except that the $V_{erase}$ potential is greater than the potential of $V_H$ (i.e. greater than 5 V). The write and retention operations of the "normally" on memory are the same as described above with reference to FIG. 7

However, the read operation of the "normally on" device differs slightly. Like, the "normally off" device of FIG. 7, vertical line 82 is induced to $V_L$ and then switched to a floating state by horizontal shift register 89. When gate shift register 80 selects a row of memory units 83 by turning on transistors 87, the voltage potential of vertical lines 82 will rise quickly from $V_L$ to $V_H$ for memory units 83 that were in an "ON" state given the low resistance of the memory unit in that state. Likewise, the voltage potential of vertical lines 82 will rise slowly from $V_L$ to $V_H$ for memory units 83 that were in an "OFF" state, given the high resistance of the memory unit in that state. As such, after the appropriate read-out time is waited, a voltage sensed by sense amplifier 88 that is greater than a read-out reference voltage will be determined to be from a previously "ON" memory unit 83, and a sensed voltage that is below a read-out reference voltage will be determined to be from a previously "OFF" memory unit 83. For the "normally on" non-volatile memory array of FIG. 8, the read-out reference voltage is an intermediate voltage level between $V_H$ and $V_L$. In a preferred embodiment, the read-out reference voltage is halfway between the difference of $V_L$ and $V_H$, and is nominally 3 V.

The invention has been described above with respect to particular illustrative embodiments. It is understood that the invention is not limited to the above-described embodiments and that various changes and modifications may be made by those skilled in the relevant art without departing from the spirit and scope of the invention.

What is claimed is:

1. An organic bistable device comprising:
   a first and a second metal electrode sandwiching a first and a second organic layer with a metal-nanocluster layer positioned between the first and second organic layers,
   and further comprising an electron blocking layer positioned between the metal-nanocluster layer and one of the metal electrodes.

2. The organic bistable device of claim 1, wherein the first and second metal electrodes are formed with any suitable metal or metal-based compound.

3. The organic bistable device of claim 2, wherein the first and second metal electrodes are selected from a group of suitable metal or metal-based compounds consisting of Al, Cu, Ag, ITO, AlSi and AlSiCu.

4. The organic bistable device of claim 3, wherein the first and second metal electrodes are formed from different materials.

5. The organic bistable device of claim 1, wherein the first and second organic layers are formed with any P-type or N-type semiconductor material.

6. The organic bistable device of claim 5, wherein the first and second organic layers are selected from a group of P-type and N-type semiconductor materials consisting of CuPc, AlDCN, and Alq3.

7. The organic bistable device of claim 6, wherein the first and second organic layers are formed from different materials.

8. The organic bistable device of claim 1, wherein the metal-nanocluster layer consists of Al nano particles in AlDCN.

9. The organic bistable device of claim 1, wherein the electron blocking layer is formed with materials with electron blocking properties.

10. The organic bistable device of claim 9, wherein the electron blocking layer is selected from a group of materials with electron blocking properties consisting of NPB, NPD, TPD, and PVK, wherein the material chosen has a higher energy gap than that of a material chosen for the first and second organic layers.

11. The organic bistable device of claim 1, which comprises a first electron blocking layer and a second electron blocking layer each positioned between the metal-nanocluster layer and a different one of the metal electrodes.

12. The organic bistable device of claim 11, wherein the first electronic blocking layer has a higher energy gap than that of the second electron blocking layer.

13. The organic bistable device of claim 12, wherein the first and second electron blocking layers are each formed with materials with electron blocking properties.

14. The organic bistable device of claim 13, wherein the first and second electron blocking layers are selected from a group of materials with electron blocking properties consisting of NPB, NPD, TPD, and PVK, wherein the material chosen has a higher energy gap than both of the first and second organic layers.

15. The organic bistable device of claim 1, further comprising an electron injection layer positioned between the electron blocking layer and one of the organic layers.

16. The organic bistable device of claim 15, wherein the electron injection layer consists of Alq3.

17. A non-volatile memory device comprising an organic bistable device according to any one of claims 1 to 16 switchably coupled to a transistor.

18. A non-volatile memory comprising:
a grid defined by gate lines and vertical lines;
a transistor switched by a gate line;
a reference voltage line; and
a memory unit comprised of an organic bistable device of any one of claims 1 to 10, 15 and 16,
wherein the first metal electrode is switchably connected by the transistor to the vertical line, and the second metal electrode is connected to the reference voltage line.

19. The non-volatile memory of claim 18, wherein the first metal electrode is in a floating state in the case that the transistor is switched off by the gate line.

20. The non-volatile memory of claim 18, wherein the reference voltage line is at ground potential, and wherein the electron blocking layer is positioned between the metal-nanocluster layer and the first organic layer.

21. The non-volatile memory of claim 18, wherein the reference voltage line is at ground potential, and wherein the electron blocking layer is positioned between the first organic layer and the first metal electrode.

22. The non-volatile memory of claim 18, wherein the reference voltage line is at voltage potential VH, and wherein the electron blocking layer is positioned between the metal-nanocluster layer and the second organic layer.

23. The non-volatile memory of claim 18, wherein the reference voltage line is at voltage potential VH, and wherein the electron blocking layer is positioned between the second organic layer and the second metal electrode.

24. A non-volatile memory comprising:
a grid defined by gate lines and vertical lines;
a transistor switched by a gate line;
a reference voltage line; and
a memory unit comprised of an organic bistable device of any one of claims 11 to 14,
wherein the first metal electrode is switchably connected by the transistor to the vertical line, and the second metal electrode is connected to the reference voltage line.

25. The non-volatile memory of claim 24, wherein the first metal electrode is in a floating state in the case that the transistor is switched off by the gate line.

26. The non-volatile memory of claim 24, wherein the reference voltage line is at ground potential, and wherein the first electron blocking layer is positioned between the metal-nanocluster layer and the first organic layer, and the second electron blocking layer is positioned between the metal-nanocluster layer and the second organic layer.

27. The non-volatile memory of claim 24, wherein the reference voltage line is at ground potential, and wherein the first electron blocking layer is positioned between the metal-nanocluster layer and the first organic layer, and the second electron blocking layer is positioned between the second organic layer and the second metal electrode.

28. The non-volatile memory of claim 24, wherein the reference voltage line is at ground potential, and wherein the first electron blocking layer is positioned between the first organic layer and the first metal electrode, and the second electron blocking layer is positioned between the metal-nanocluster layer and the second organic layer.

29. The non-volatile memory of claim 24, wherein the reference voltage line is at ground potential, and wherein the first electron blocking layer is positioned between the first organic layer and the first metal electrode, and the second electron blocking layer is positioned between the second organic layer and the second metal electrode.

30. The non-volatile memory of claim 24, wherein the reference voltage line is at voltage potential VH, and wherein the first electron blocking layer is positioned between the metal-nanocluster layer and the second organic layer, and the second electron blocking layer is positioned between the metal-nanocluster layer and the first organic layer.

31. The non-volatile memory of claim 24, wherein the reference voltage line is at voltage potential VH, and wherein the first electron blocking layer is positioned between the second organic layer and the second metal electrode, and the second electron blocking layer is positioned between the metal-nanocluster layer and the first organic layer.

32. The non-volatile memory of claim 24, wherein the reference voltage line is at voltage potential VH, and wherein the first electron blocking layer is positioned between the metal-nanocluster layer and the second organic layer, and the second electron blocking layer is positioned between the first organic layer and the first metal electrode.

33. The non-volatile memory of claim 24, wherein the reference voltage line is at voltage potential VH, and wherein the first electron blocking layer is positioned between the second organic layer and the second metal electrode, and the second electron blocking layer is positioned between the first organic layer and the first metal electrode.

34. A method of operating the non-volatile memory of claim 18, wherein the method resets the memory units, the method comprising the steps of:
   selecting a line of memory units by applying a voltage to the gate line to turn on the transistor;
   applying a voltage potential Verase to the vertical line;
   deselecting the line of memory units by applying a voltage to the gate line to turn off the transistor; and
   normalizing the vertical line by applying the voltage potential VL.

35. A method of operating the non-volatile memory of claim 18, wherein the method writes to the organic bistable devices, the method comprising the steps of:
   selecting a line of memory units by applying a voltage to the gate line to turn on the transistor;
   applying a voltage potential VH to the vertical line in the case that the line of memory units is to be turned on, and applying a voltage potential VL to the vertical line in the case that the line of memory units is to be turned off;
   deselecting the line of memory units by applying a voltage to the gate line to turn off the transistor; and
   normalizing the vertical line by applying the voltage potential VL.

36. A method of operating the non-volatile memory of claim 18, wherein the method reads the memory units and wherein the reference voltage line is connected to a ground potential, the method comprising the steps of:
   normalizing the vertical line by applying a voltage potential VL;
   removing the voltage potential VL from the vertical line so that it is floating;
   selecting a line of memory units by applying a voltage to the gate line to turn on the transistor;
   waiting a predetermined time;
   connecting the vertical line of one memory unit to a sense amplifier; and
   reading the voltage of the connected vertical line, wherein a reading above a read-out reference voltage indicates an off state, and a reading below a read-out reference voltage indicates an on state.

37. The method according to claim 36, wherein the read-out reference voltage is an intermediate voltage between ground and VL.

38. A method of operating the non-volatile memory of claim 18, wherein the method reads the memory units and wherein the reference voltage line is connected to a voltage potential VH, the method comprising the steps of:
   normalizing the vertical line by applying a voltage potential VL;
   removing the voltage potential VL from the vertical line so that it is floating;
   selecting a line of memory units by applying a voltage to the gate line to turn on the transistor;
   waiting a predetermined time;
   connecting the vertical line of one memory unit to a sense amplifier; and
   reading the voltage of the connected vertical line, wherein a reading below a read-out reference voltage indicates an off state, and a reading above a read-out reference voltage indicates an on state.

39. The method according to claim 38, wherein the read-out reference voltage is an intermediate voltage between VH and VL.

40. A method of operating the non-volatile memory of claim 24, wherein the method resets the memory units, the method comprising the steps of:
   selecting a line of memory units by applying a voltage to the gate line to turn on the transistor;
   applying a voltage potential Verase to the vertical line;
   deselecting the line of memory units by applying a voltage to the gate line to turn off the transistor; and
   normalizing the vertical line by applying the voltage potential VL.

41. A method of operating the non-volatile memory of claim 24, wherein the method writes to the organic bistable devices, the method comprising the steps of:
   selecting a line of memory units by applying a voltage to the gate line to turn on the transistor;
   applying a voltage potential VH to the vertical line in the case that the line of memory units are to be turned on, and applying a voltage potential VL to the vertical line in the case that the line of memory units are to be turned off;
   deselecting the line of memory units by applying a voltage to the gate line to turn off the transistor; and
   normalizing the vertical line by applying the voltage potential VL.

42. A method of operating the non-volatile memory of claim 24, wherein the method reads the memory units and wherein the reference voltage line is connected to a ground potential, the method comprising the steps of:
   normalizing the vertical line by applying a voltage potential VL;
   removing the voltage potential VL from the vertical line so that it is floating;
   selecting a line of memory units by applying a voltage to the gate line to turn on the transistor;
   waiting a predetermined time;
   connecting the vertical line of one memory unit to a sense amplifier; and
   reading the voltage of the connected vertical line, wherein a reading above a read-out reference voltage indicates an off state, and a reading below a read-out reference voltage indicates an on state.

43. The method according to claim 42, wherein the read-out reference voltage is an intermediate voltage between ground and VL.

44. A method of operating the non-volatile memory of claim 24, wherein the method reads the memory units and wherein the reference voltage line is connected to a voltage potential VH, the method comprising the steps of:
   normalizing the vertical line by applying a voltage potential VL;
   removing the voltage potential VL from the vertical line so that it is floating;
   selecting a line of memory units by applying a voltage to the gate line to turn on the transistor;
   waiting a predetermined time;
   connecting the vertical line of one memory unit to a sense amplifier; and
   reading the voltage of the connected vertical line, wherein a reading below a read-out reference voltage indicates an off state, and a reading above a read-out reference voltage indicates an on state.

45. The method according to claim 44, wherein the read-out reference voltage is an intermediate voltage between VH and VL.

* * * * *